(12) United States Patent
Zahner

(10) Patent No.: US 11,031,198 B2
(45) Date of Patent: Jun. 8, 2021

(54) ARRANGEMENT AND METHOD FOR CONNECTING CONTACT POINTS TO A REFERENCE POTENTIAL

(71) Applicant: SIEMENS AKTIENGESELLSCHAFT, Munich (DE)

(72) Inventor: Ulrich Zahner, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/735,935

(22) Filed: Jan. 7, 2020

(65) Prior Publication Data

US 2020/0219685 A1 Jul. 9, 2020

(30) Foreign Application Priority Data

Jan. 7, 2019 (DE) .............................. 102019200095

(51) Int. Cl.
*H01H 35/00* (2006.01)
*H01H 29/32* (2006.01)
*G01R 19/165* (2006.01)

(52) U.S. Cl.
CPC ........... *H01H 29/32* (2013.01); *G01R 19/165* (2013.01)

(58) Field of Classification Search
CPC ........ H01H 29/32; H01H 9/12; G01R 19/165; H05F 3/02
USPC ........................................................ 307/131
See application file for complete search history.

(56) References Cited

U.S. PATENT DOCUMENTS

| 3,160,785 | A | * | 12/1964 | Munday | ..................... | H05F 3/02 |
| | | | | | | 361/215 |
| 5,754,388 | A | * | 5/1998 | Schmidt | ..................... | H05F 3/02 |
| | | | | | | 361/215 |
| 2005/0155782 | A1 | | 7/2005 | Westberry | | |

FOREIGN PATENT DOCUMENTS

| DE | 207000 C | 2/1909 |
| DE | 112007002875 B4 | 5/2012 |
| GB | 190603541 A | 5/1906 |
| WO | WO2008/083638 A1 | 7/2008 |

OTHER PUBLICATIONS

International Standard: "Low-voltage electrical installations—Part 4-41: Protection for safety—Protection against electric shock" IEC 60364-4-41:2005, IEC 3,Rue De Varembe. Po Box 131, CH-1211 Geneva 20, Switzerland, Dec. 15, 2005 (Dec. 15, 2005), pp. 1-32, XP082010308, [found on the internet Dec. 15, 2005].

* cited by examiner

*Primary Examiner* — Ryan Jager
(74) *Attorney, Agent, or Firm* — Laurence Greenberg; Werner Stemer; Ralph Locher

(57) ABSTRACT

An arrangement has an electrical device with two or more electrical contact points. A fluid-based reference potential connecting device is suitable for connecting the electrical contact points to a reference potential. The fluid-based reference potential connecting device has an annular fluid line which connects the contact points in series, and, when a fluid flows through the fluid line, the fluid successively wets the contact points, starting from a starting point, contact point by contact point, along a predefined flow direction.

17 Claims, 7 Drawing Sheets

ARRANGEMENT AND METHOD FOR CONNECTING CONTACT POINTS TO A REFERENCE POTENTIAL

CROSS-REFERENCE TO RELATED APPLICATION

This application claims the priority, under 35 U.S.C. § 119, of German patent application DE 10 2019 200 095, filed Jan. 7, 2019; the prior application is herewith incorporated by reference in its entirety.

BACKGROUND OF THE INVENTION

Field of the Invention

The invention relates to an arrangement having an electrical device, which has at least two electrical contact points, and having a fluid-based reference potential connecting device which is suitable for connecting the electrical contact points to a reference potential. Such an arrangement is known from commonly assigned German patent specification DE 11 2007 002 875 B4.

SUMMARY OF THE INVENTION

The invention is based on the object of making an arrangement of the previously known type particularly safe.

With the above and other objects in view there is provided, in accordance with the invention, an arrangement, comprising:

an electrical device having a plurality electrical contact points and having a fluid-based reference potential connecting device configured for connecting said electrical contact points to a reference potential;

said fluid-based reference potential connecting device having an annular fluid line that connects said contact points in series; and when a fluid flows through said fluid line, said fluid successively wets said contact points, starting from a starting point, one contact point after another contact point, along a predefined flow direction.

The objects of the invention are achieved, in accordance with the invention, by providing a fluid-based reference potential connecting device with an annular fluid line, or ring-shaped flow fluid line, which connects the contact points in series, and, if a fluid flows through the fluid line, for the fluid to successively wet the contact points, starting from a starting point, contact point by contact point, along a predefined flow direction.

An important advantage of the arrangement according to the invention can be seen in the fact that the fluid line is annular and the contact points are connected in series, with the result that the contact points are successively wetted and reliable connection of all contact points of the electrical device to the reference potential, for example ground, can be reliably checked and monitored, for example by monitoring the electrical currents flowing in the fluid line.

The reference potential connecting device preferably has an injection device which is connected to the fluid line at an injection point and is suitable for feeding conductive fluid into the fluid line at the injection point and/or for increasing the conductivity of a fluid in the fluid line by feeding in a substance which increases the conductivity.

The electrical device preferably has, at at least one of the contact points, a series resistor and/or a light-emitting element, through which the current flows if current flows via the contact points.

The electrical device preferably comprises, at at least one of the contact points, a bypass circuit which, if current flows via the contact point, establishes a conductive connection to another contact point, in particular the contact point which is closest in terms of location and/or potential. The bypass circuit preferably has at least one relay.

The fluid line preferably has, downstream of the injection point and upstream of the first contact point in the fluid flow direction, a measuring section whose electrical conductivity is monitored.

It is also advantageous if a current measuring device (also called first current measuring device below) is connected to the fluid line at a connection point which is downstream of the injection point and upstream of the first contact point in the fluid flow direction, a first measuring connection of which current measuring device is connected to the connection point and a second measuring connection of which current measuring device is at reference potential, and a current or voltage source is connected at an excitation point which is between the injection point and the connection point of the current measuring device, which current or voltage source causes a current flow between the excitation point and the connection point as soon as the line section of the fluid line between the excitation point and the connection point has been filled with conductive fluid.

A control device is preferably connected to the current measuring device, which control device monitors the measured current values from the current measuring device and controls the injection device.

In addition, it is considered to be advantageous if a further current measuring device (also called second current measuring device below) is connected to the fluid line at a further connection point which is downstream of the last contact point and upstream of the injection point in the fluid flow direction, a first measuring connection of which further current measuring device is connected to the further connection point and a second measuring connection of which further current measuring device is at reference potential, and the further current measuring device captures a further current rise which occurs after conductive fluid has been fed in and/or after a substance increasing the conductivity has been fed in and after the further connection point has been reached by the conductive fluid.

The control device is preferably connected to the further current measuring device and, on the basis of the captured further current rise, preferably concludes that the fluid line, up to and including the further connection point and therefore up to and including the last contact point, has been filled with conductive fluid.

Moreover, it is advantageous if a switching device is arranged between the further connection point and the reference potential and can interrupt a current flow between the further connection point and the reference potential.

The control device preferably disconnects the switching device after the adjustment or grounding operation has been concluded and/or after the current flowing through the first and/or second current measuring device has fallen and thus prevents a current flow through the second current measuring device to the reference potential.

The control device is preferably configured in such a manner that it compares the measured current value from the first current measuring device before the first contact point is reached by the fluid with the measured current value after the switching device has been disconnected and infers a closed conductive fluid circuit if the measured current value before the first contact point is reached by the fluid is lower than the measured current value after the switching device has been disconnected.

The reference potential connecting device preferably comprises a drain valve which makes it possible to drain the fluid in the fluid line.

The reference potential is preferably the ground potential; the reference potential connecting device therefore preferably forms a grounding device.

The invention also relates to a method for connecting an electrical device, which has at least two electrical contact points, to a reference potential by means of a fluid-based reference potential connecting device.

With respect to such a method, the invention provides for the fluid-based reference potential connecting device to have an annular fluid line which connects the contact points in series, and for the annular fluid line to be filled with conductive fluid so as to form a conductive fluid ring, and/or for the conductivity of a fluid in the fluid line to be increased by feeding in a substance which increases the conductivity, and for the contact points to be successively wetted with the conductive fluid and, as a result, to be electrically connected to one another in succession.

With respect to the advantages of the method according to the invention, reference is made to the above explanations in connection with the arrangement according to the invention.

It is considered to be advantageous if the electrical device has a series resistor and/or a light-emitting element at at least one of the contact points, and the current flow via the contact point into the conductive fluid is limited by the series resistor and/or the light-emitting element.

Alternatively or additionally, provision may be advantageously made for the electrical device to have, at at least one of the contact points, a bypass circuit which, if a current flows via the contact point, establishes a conductive connection to another contact point, in particular the contact point which is closest in terms of location and/or potential, and for an immediate discharge between the contact points which are connected to one another to be carried out.

Alternatively or additionally, provision may be advantageously made for the fluid line to have a measuring section downstream of the injection point in the fluid flow direction and—as seen in the flow direction—upstream of the first contact point, and for the electrical conductivity of the measuring section to be monitored.

Alternatively or additionally, provision may be advantageously made for a current measuring device to be connected to the fluid line at a connection point which is downstream of the injection point and upstream of the first contact point in the fluid flow direction, a first measuring connection of which current measuring device is connected to the connection point and a second measuring connection of which current measuring device is at reference potential, and for a current or voltage source to be connected at an excitation point which is between the injection point and the connection point of the current measuring device, which current or voltage source causes a current flow between the excitation point and the connection point as soon as the line section of the fluid line between the excitation point and the connection point has been filled with conductive fluid, for the measured current values from the current measuring device to be monitored, and for the injection device to be controlled on the basis of the measured current values.

Alternatively or additionally, provision may be advantageously made for a current rise, which occurs after conductive fluid has been fed in and/or after a substance which increases the conductivity has been fed in and after the first contact point has been reached by the conductive fluid, to be captured using the current measuring device, and for it to be concluded, on the basis of the current rise, that the fluid line up to the first connection point has been filled with conductive fluid.

Alternatively or additionally, provision may be advantageously made for a further current rise, which occurs after the first contact point has been reached by the conductive fluid, to be captured using the current measuring device, and for it to be concluded, on the basis of the further current rise, that the fluid line up to the first contact point has been filled with the conductive fluid.

Alternatively or additionally, provision may be advantageously made for a further current measuring device to be connected to the fluid line at a further connection point which is downstream of the last contact point and upstream of the injection point in the fluid flow direction, a first measuring connection of which further current measuring device is connected to the further connection point and a second measuring connection of which further current measuring device is at reference potential, and for the further measured current values from the further current measuring device to be monitored.

Alternatively or additionally, provision may be advantageously made for a current rise, which is measured by the further current measuring device and occurs after the conductive fluid has been fed in and/or after the substance which increases the conductivity has been fed in and after the further connection point has been reached by the conductive fluid, to be captured, and for it to be concluded, on the basis of this current rise, that the fluid line, up to and including the last contact point and the further connection point, has been filled with conductive fluid.

Alternatively or additionally, provision may be advantageously made for a switching device to be arranged between the further connection point and the reference potential and to be able to interrupt a current flow between the further connection point and the reference potential, and for the switching device to be disconnected after the grounding operation has been concluded or after the current flowing through the first and/or second current measuring device has fallen, and for a current flow through the second current measuring device to the reference potential to be prevented.

Alternatively or additionally, provision may be advantageously made for the measured current value from the first current measuring device before the first contact point is reached by the fluid to be compared with the measured current value from the first current measuring device after the switching device has been disconnected, and for a closed conductive fluid circuit to be inferred if the measured current value from the first current measuring device before the first contact point is reached by the fluid is lower than the measured current value from the first current measuring device after the switching device has been disconnected.

Other features which are considered as characteristic for the invention are set forth in the appended claims.

Although the invention is illustrated and described herein as embodied in an arrangement and method for connecting contact points to a reference potential, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

For the sake of clarity, the same reference signs are used for identical or comparable components throughout the figures.

DETAILED DESCRIPTION OF THE INVENTION

Figure 1:
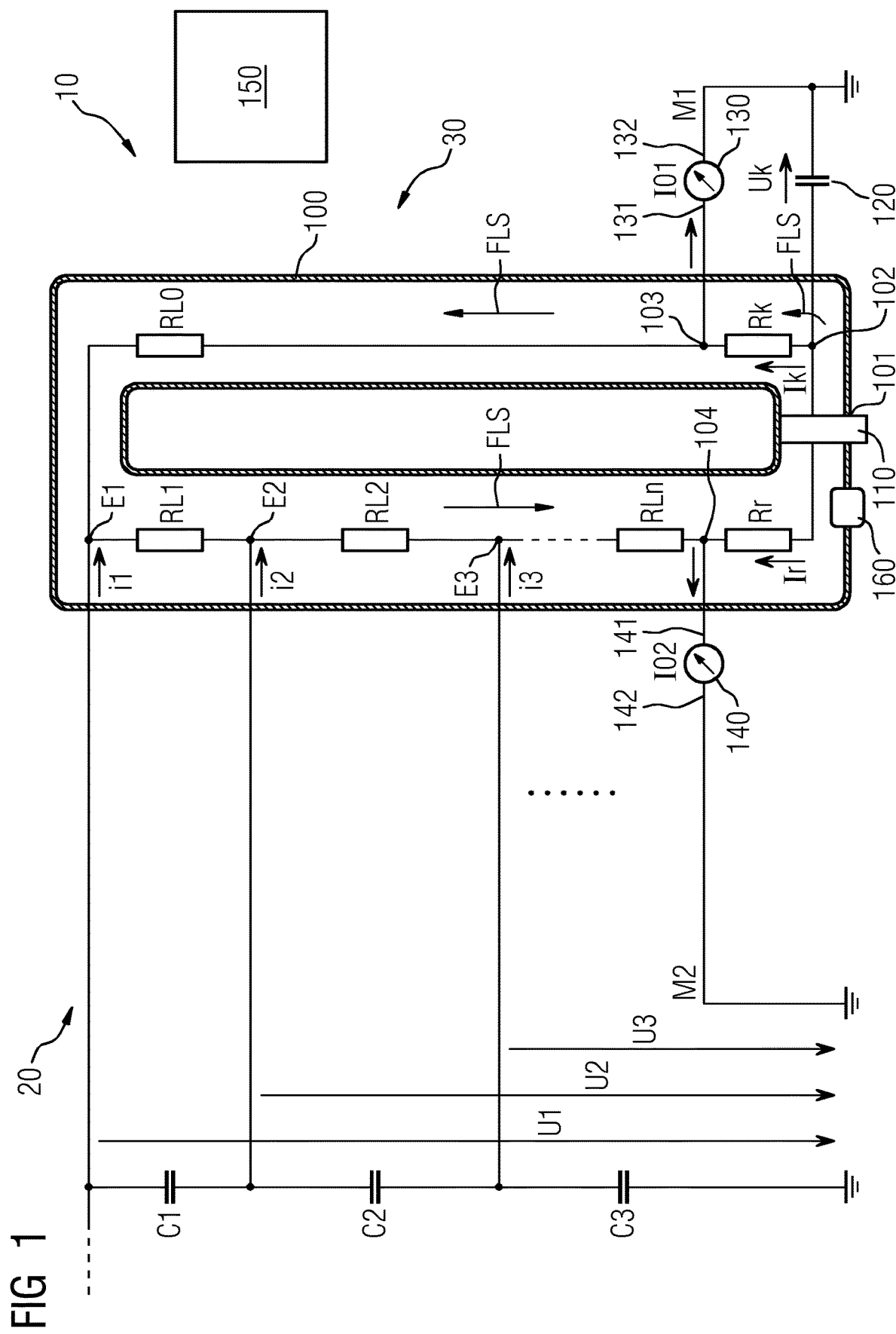
FIG. 1 is a diagram showing an exemplary embodiment of an arrangement according to the invention, on the basis of which an exemplary embodiment of the method according to the invention is explained.

Referring now to the figures of the drawing in detail and first, particularly, to FIG. 1 thereof, there is shown an arrangement having an electrical device 20 which has a multiplicity of electrical contact points. Three such contact points are shown, by way of example, in FIG. 1 and are indicated using the reference signs E1, E2 and E3. The three contact points E1, E2 and E3 are at different electrical potentials and therefore have different electrical voltages U1, U2 and U3 with respect to a reference potential. The reference potential is the ground potential, for example. In the exemplary embodiment according to FIG. 1, electrical capacitors C1, C2 and C3 are charged and ensure the potential differences between the contact points E1, E2 and E3. The "plurality of contact points" thus denotes two or more, or at least two, contact points.

In order to discharge the capacitors C1, C2 and C3 and to ground the contact points E1, E2 and E3, the arrangement 10 has a reference potential connecting device, here in the form of a grounding device 30. The grounding device 30 comprises a fluid line 100 which can be filled with a conductive fluid.

In order to fill the fluid line 100 with the conductive fluid, an injection device 110 is connected at a starting point 101 of the fluid line 100. The injection device can feed conductive fluid into the fluid line 100 at the starting point 101 and/or can increase the conductivity of a fluid which is already in the fluid line 100 by feeding in a substance which increases the conductivity. The starting point 101 of the fluid line 100 therefore forms an injection point of the injection device 110.

It is assumed, by way of example, below that, after activation, the injection device 110 feeds a conductive fluid into the fluid line 100 at the starting point 101 and the fluid which has been fed in flows through the fluid line 100 along a fluid flow direction FLS illustrated in FIG. 1. In the exemplary embodiment according to FIG. 1, the fluid flow direction FLS is therefore anticlockwise.

Downstream of the injection point and downstream of the starting point 101, as seen in the fluid flow direction FLS, there is an excitation point 102 at which a voltage source 120 is connected. The voltage source 120 generates a measuring voltage Uk between the excitation point 102 and the ground potential.

The first measuring connection 131 of a current measuring device 130, also called first current measuring device below, is connected at a connection point 103 of the fluid line 100 which is downstream thereof in the fluid flow direction FLS. A second measuring connection 132 of the current measuring device 130 is at ground potential.

Along the fluid flow direction FLS downstream of the connection point 103, the electrical contact points E1, E2 and E3 are connected to the fluid line 100, with the result that these contact points are successively wetted with the conductive fluid if the conductive fluid is fed in, to be precise starting with the first contact point E1 in the fluid flow direction FLS.

The first measuring connection 141 of a further current measuring device 140, also called second current measuring device below, is connected at a further connection point 104. A second measuring connection 142 of the further current measuring device 140 is connected to the ground potential.

A control device 150 of the grounding device 30 monitors and controls the injection device 110, for example on the basis of the measured current values I01 and I02 from the two current measuring devices 130 and 140. If a substance which increases the conductivity is injected by the injection device 110, for example, the control device 150 can set the degree of injection on the basis of the measured current values from the first current measuring device 130, for example.

In order to ground the electrical contact points E1, E2 and E3 of the electrical device 20, the arrangement 10 is preferably operated as follows:

A conductive fluid is fed into the fluid line 100 at the starting point 101 at the time t0 (see FIG. 7) using the injection device 110, which conductive fluid flows from the starting point 101 along the fluid flow direction FLS in the direction of the excitation point 102 and flows from there to the connection point 103. As soon as the fluid has wetted the connection point 103, an electrical current will flow in that measuring section of the fluid line 100 which is formed by the excitation point 102 and the connection point 103. This current Ik is measured by the first current measuring device 130.

Figure 7:
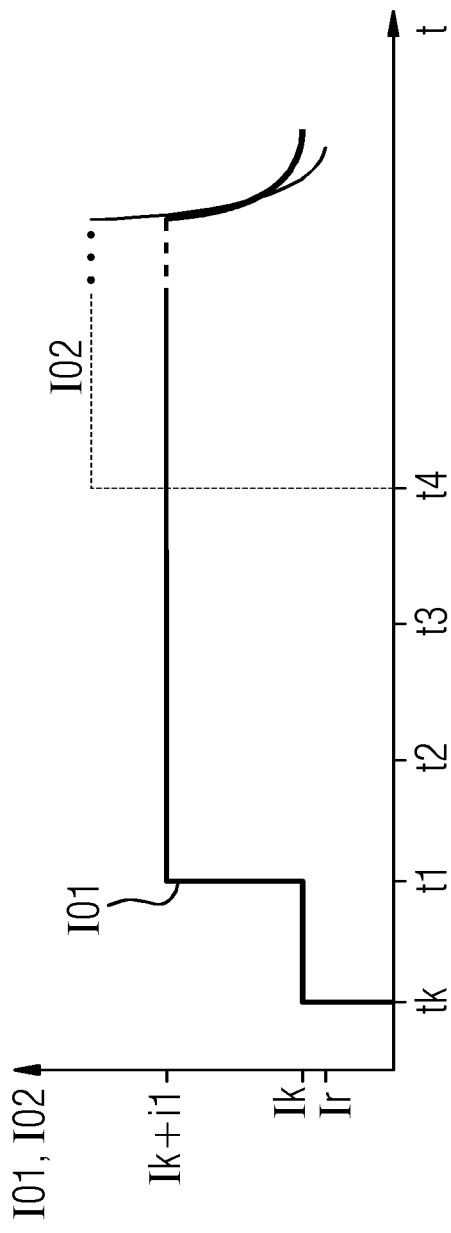
FIG. 7 shows, by way of example, the current profile in the arrangement according to FIG. 1.

The profile of the current I01 measured by the current measuring device 130 is shown in more detail, by way of example, in FIG. 7. It can be seen that the conductive fluid has reached the connection point 103 at the time tk, with the result that a current Ik can flow between the excitation point 102 and the connection point 103. The electrical resistance of the conductive fluid between the excitation point 102 and the connection point 103 is indicated using the reference sign Rk in FIG. 1, for example. The measured current value I01 at the time tk is therefore:

$I01(t=tk)=Ik=Uk/Rk$.

Starting from the starting point 103, the fluid will continue to flow in the direction of the first contact point E1 along the fluid flow direction FLS. As soon as the first contact point E1 in the fluid line 100 has been reached at the time t1, a current i1 will flow via the fluid line 100 in the direction of the first connection point 103 as a result of the potential present at the electrical contact point E1 or the voltage U1 applied thereto. The current i1 injected into the fluid line 100 by the voltage U1 is calculated as follows:

$i1=U1/RL0$, where RL0 denotes the electrical resistance of the conductive fluid in the fluid line 100 between the connection point 103 and the contact point E1. The reference signs i1, i2 and i3 denote the currents via the contact points E1, E2 and E3.

From the first contact point E1, the fluid will flow on to the next contact point E2 and will wet the latter at the time t2. As soon as the contact point E2 has been wetted, a discharge current can flow between the two contact points E1 and E2 via the fluid line 100. In this case, the discharge current is calculated as follows:

$Ie1\ (t=t2)=(U1-U2)/RL1$, where Ie1 denotes the discharge current and RL1 denotes the electrical resistance of the conductive fluid in the fluid line 100 between the two contact points E1 and E2.

The electrically conductive fluid will then reach the third contact point E3 at the time t3, with the result that a discharge current Ie2 can also flow between the second contact point E2 and the third contact point E3.

$Ie2(t=t3)=(U2-U3)/RL2$, where Ie2 denotes the discharge current and RL2 denotes the electrical resistance of the conductive fluid in the fluid line 100 between the two contact points E2 and E3.

As soon as the electrical fluid reaches the further connection point 104 and therefore the further current measuring device 140, the three contact points E1, E2 and E3 are connected to ground potential. The current I02 measured by the second current measuring device 140 results from the voltage U3 at the third contact point E3 and the electrical resistance RLn of the fluid line 100 between the third contact point E3 and the further connection point 104, to which the further current measuring device 140 is connected.

The electrically conductive fluid will then reach the injection device 110 again, as a result of which the annular, or ring-shaped fluid line 100 forms an annularly closed conductive fluid circuit.

As a result of the current flow I02 in the direction of ground potential and as a result of the current flow between the contact points E1 and E2 and the current flow between the contact points E2 and E3 of the electrical device 20, all electrical contact points are grounded and discharged, with the result that the currents I01 and I02 will fall over time t; this is shown by FIG. 7.

It can be seen in FIG. 7 that, after the discharge has been concluded, the current I01 through the first current measuring device 130 falls again to a value of:

$I01=Ik=Uk/Rk$

The current I02 measured by the second current measuring device 140 falls to a value of:

$I02=Ir=Uk/Rr$ where Rr denotes the electrical resistance of the conductive fluid in the fluid line 100 between the further connection point 104 and the excitation point 102.

The control device 150 of the grounding device 30 monitors the measured current values from the two current measuring devices 130 and 140 and can infer, from the temporal profile of the current profiles (cf. FIG. 7), that and when the contact points E1, E2 and E3 have been safely grounded; this is case as soon as the currents I01 and I02 have reached the values Ik and Ir.

Figure 2:
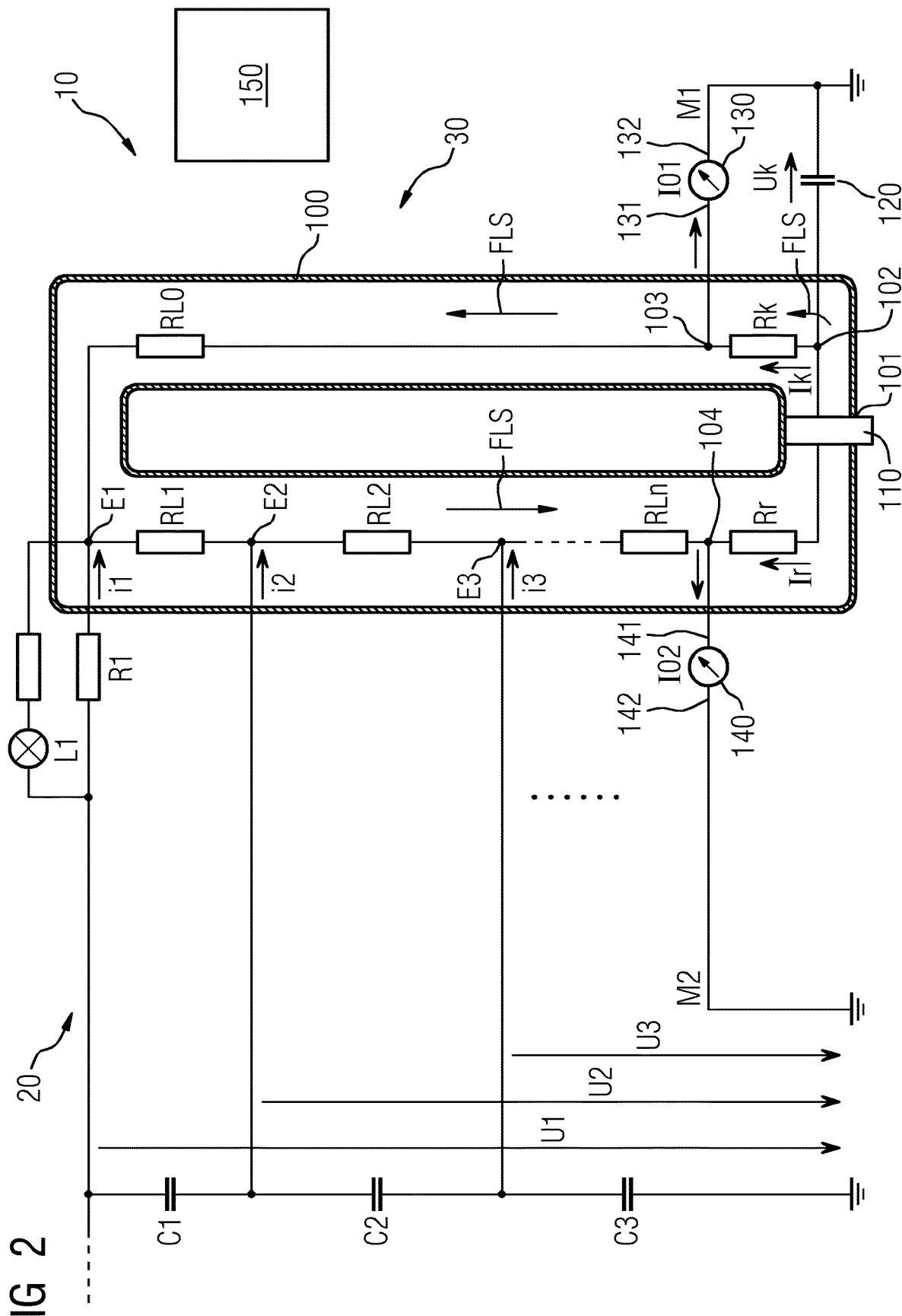
FIG. 2 shows a second exemplary embodiment of an arrangement according to the invention in which there are resistors for current limitation.

FIG. 2 shows an exemplary embodiment of an arrangement 10 in which the electrical device 20 has a series resistor R1 and a light-emitting element L1 at at least one contact point, for example the first contact point E1, for the purpose of limiting the discharge currents. The series resistor R1 and the light-emitting element L1 limit the current i1 which flows into the fluid line 100 via the first contact point E1.

The other contact points E2 and/or E3 can each be equipped with a series resistor and/or a light-emitting element in a corresponding manner.

Figure 3:
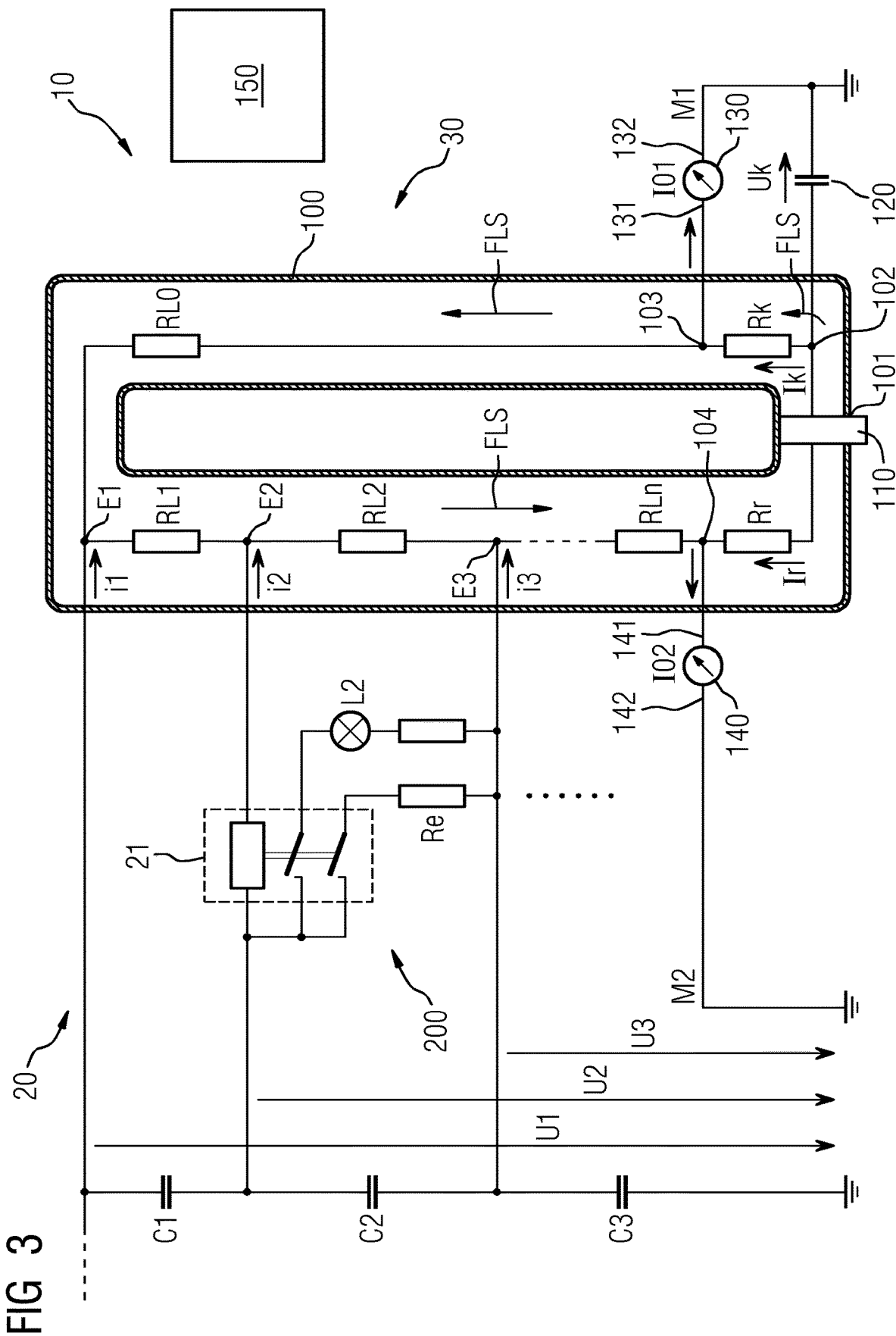
FIG. 3 shows a third exemplary embodiment of an arrangement according to the invention in which a relay is present between two contact points of the electrical device, which relay can directly establish a conductive connection between the two contact points.

FIG. 3 shows an exemplary embodiment of an arrangement 10 in which the electrical device 20 has a bypass circuit 200 with a relay 21 between at least two contact points, here the second contact point E2 and the third contact point E3. If a current i2 flows via the second contact point E2, the relay 21 connects the second contact point E2 to the third contact point E3 via a resistor Re and/or a light-emitting element L2, with the result that a discharge current can flow between the two contact points E2 and E3 after the time t=t2 at which the fluid wets the second contact point E2, to be precise even before the third contact point has been wetted with the conductive fluid.

In the exemplary embodiment, the bypass circuit 200 therefore comprises the relay 21, the resistor Re and the light-emitting element L2.

After the time t=t3 at which the fluid wets the third contact point E3, the fluid-based current flows parallel to the direct discharge current between the two contact points E2 and E3 via the fluid line 100.

The discharge current parallel to the fluid line is therefore triggered by the current i2 via the second contact point E2, that is to say even before the current can flow between the two contact points E2 and E3 via the fluid.

In the exemplary embodiment according to FIG. 3, a relay 21 is provided only between the second contact point E2 and the third contact point E3. Other contact points, for example the first contact point E1 and the second contact point E2, can also be connected to one another in a corresponding manner via a corresponding relay.

Figure 4:
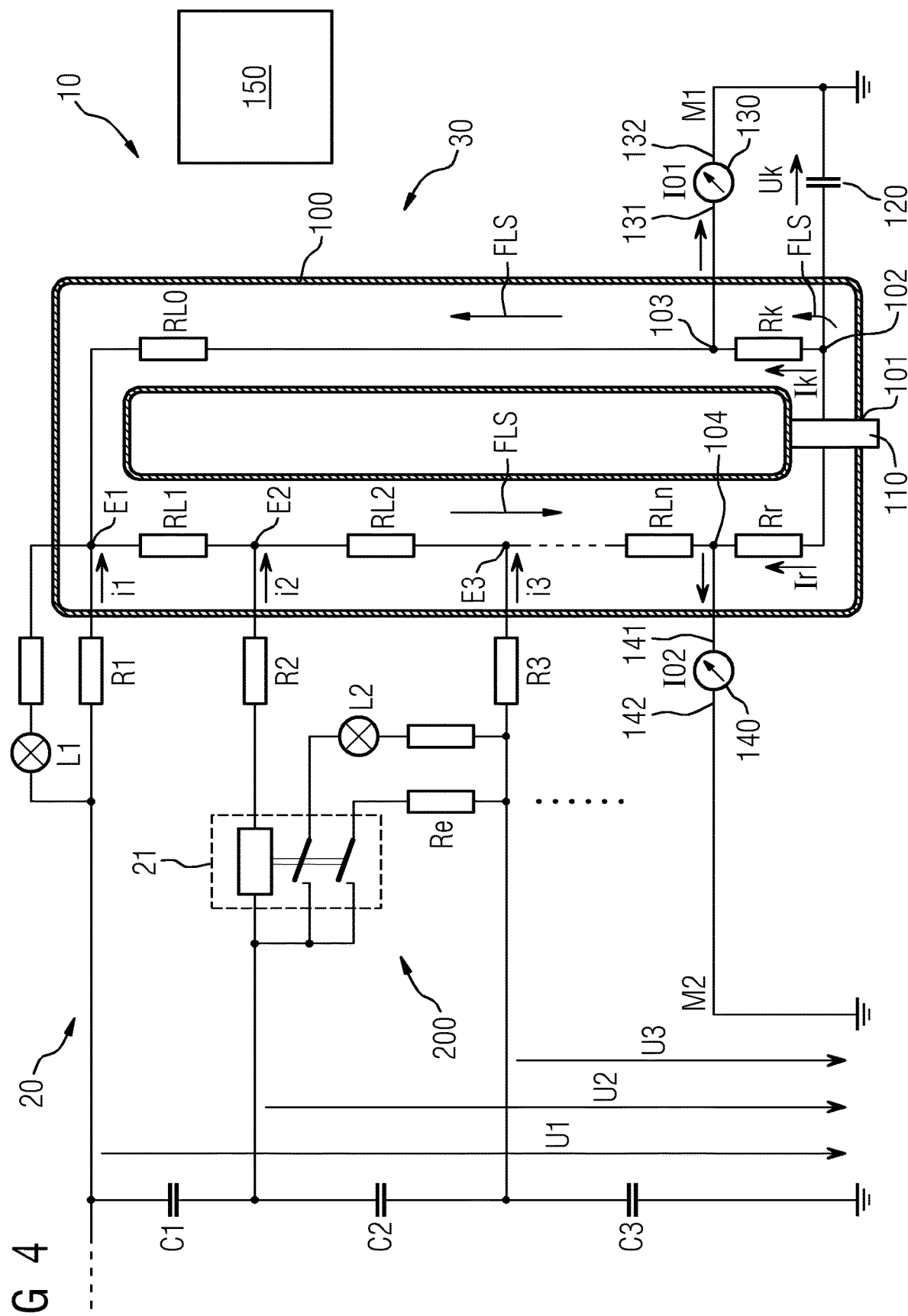
FIG. 4 shows a fourth exemplary embodiment of an arrangement according to the invention in which a relay is present between contact points of the electrical device and resistors for current limitation are provided.

FIG. 4 shows an exemplary embodiment of an arrangement in which one or more contact points, for example the second and third contact points E2, E3, are equipped both with a relay 21 and with a series resistor R2 and R3. The embodiment according to FIG. 4 is therefore a combination of the embodiment variants according to FIGS. 2 and 3.

Figure 5:
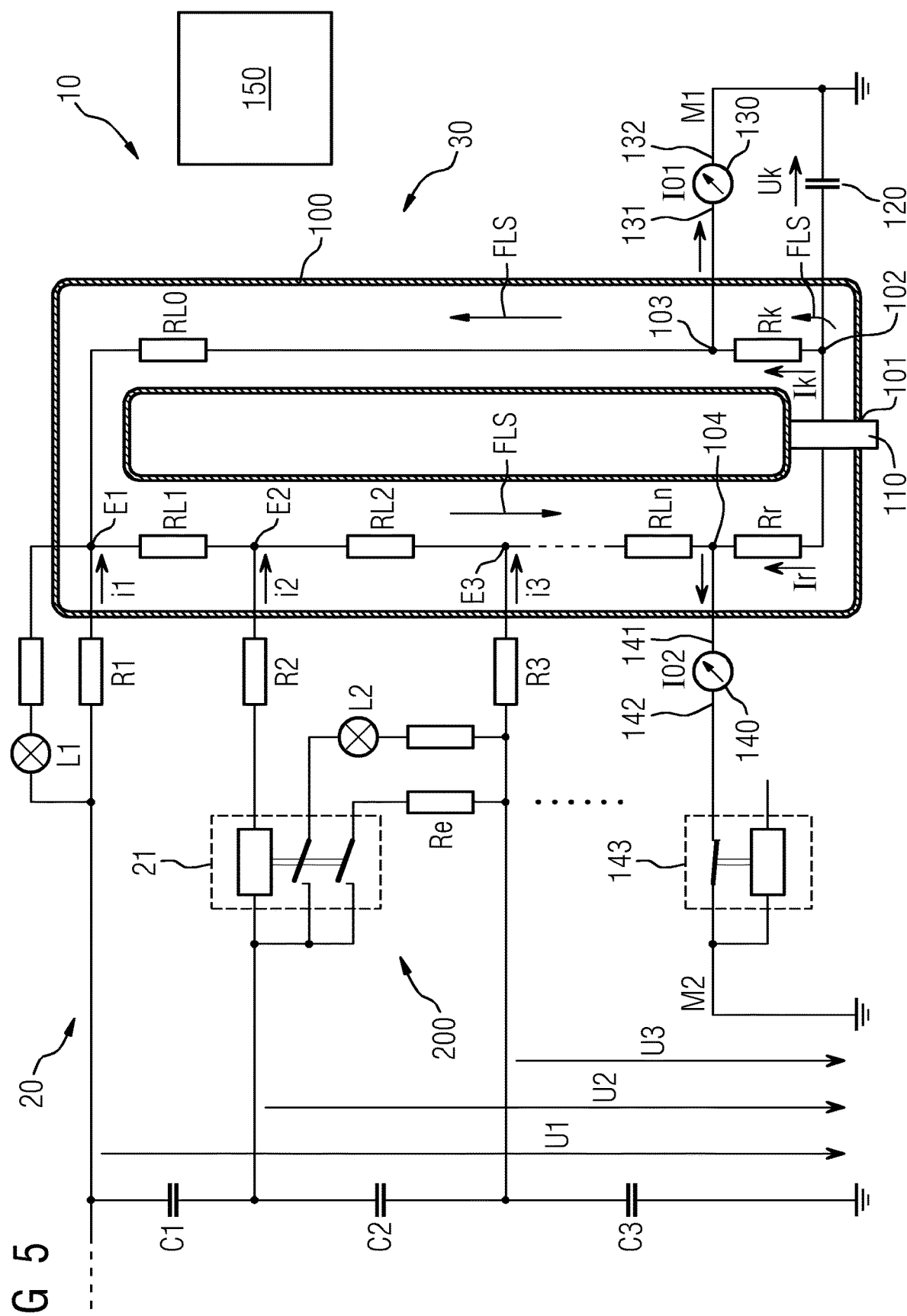
FIG. 5 shows a fifth exemplary embodiment of an arrangement according to the invention in which a switching device for deactivating the further current measuring device is provided.

FIG. 5 shows an exemplary embodiment of an arrangement in which the second current measuring device 140 is equipped with a switching device 143 which—under the control of the control device 150—can be opened and can disconnect a current flow I02 via the further current measuring device 140.

The control device 150 will preferably disconnect the switching device 143 after the completion of the discharge operation in order to prevent a current I02 via the further current measuring device 140. This procedure makes it possible to use the first current measuring device 130 to check whether the fluid line 100 is permanently completely filled with conductive fluid and the contact points E1, E2 and E3 are permanently safely grounded.

This is because, after the further current measuring device 140 has been disconnected, a current, which is injected by the voltage source 120, flows through the entire fluid line 100. A partial current will flow via the resistance Rk, that is to say between the excitation point 102 and the connection point 103. A second partial current flows from the excitation point 102 to the connection point 103 via the contact points E3, E2 and E1 and therefore indicates complete wetting of the contact points E1, E2 and E3 with the conductive fluid.

The total current which is formed by the sum of the two partial currents and is measured by the first current measuring device 130 is then therefore greater than the current Ik at the start of the grounding operation, since the following applies:

$$I01 = Ik + Ir$$

$$I01 = Uk/Rk + Uk/(Rr + RLn + RL2 + RL1 + RL0)$$

Figure 6:
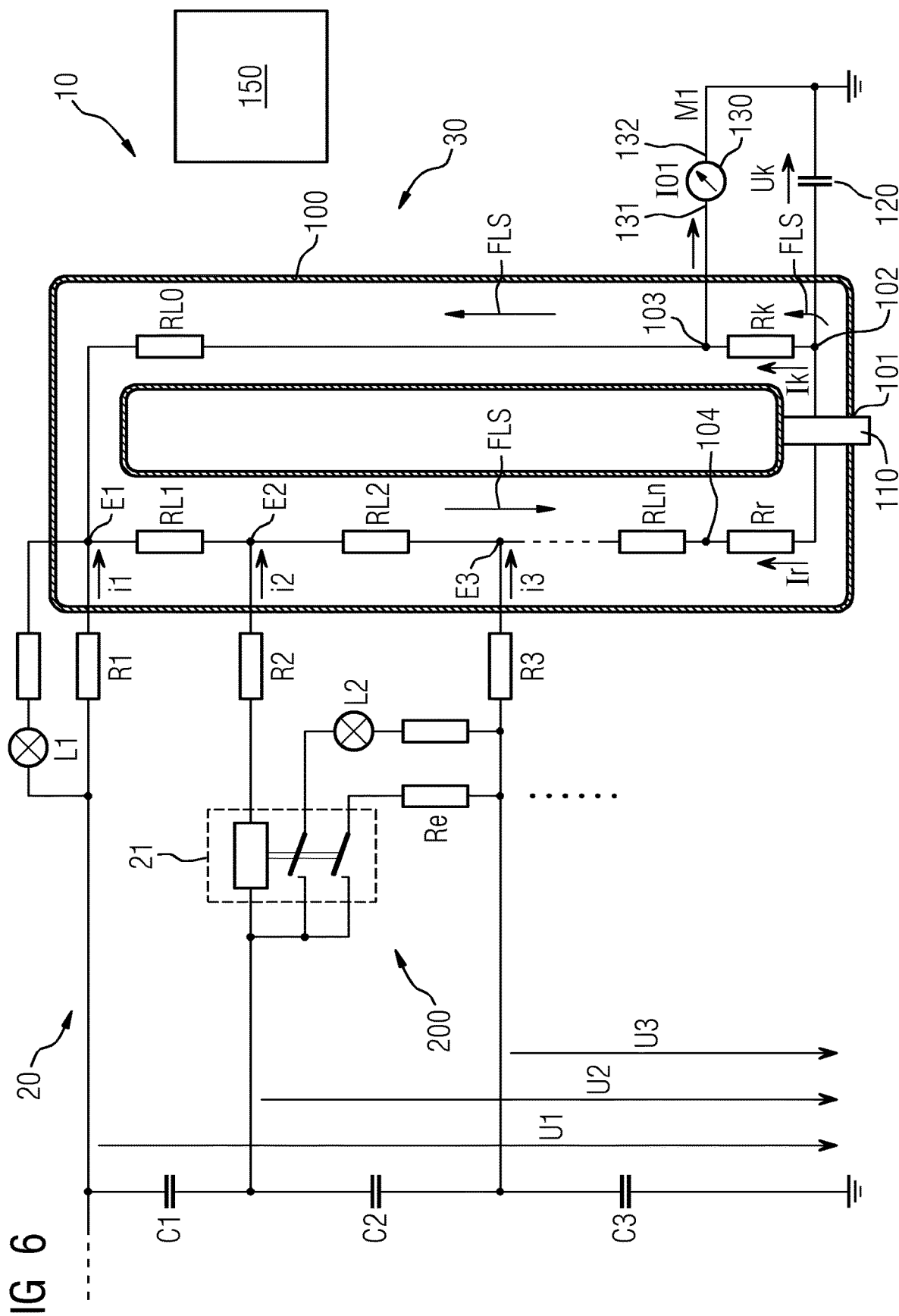
FIG. 6 shows a sixth exemplary embodiment of an arrangement according to the invention in which the further current measuring device shown in FIGS. 1 to 5 is absent.
Figure 8:
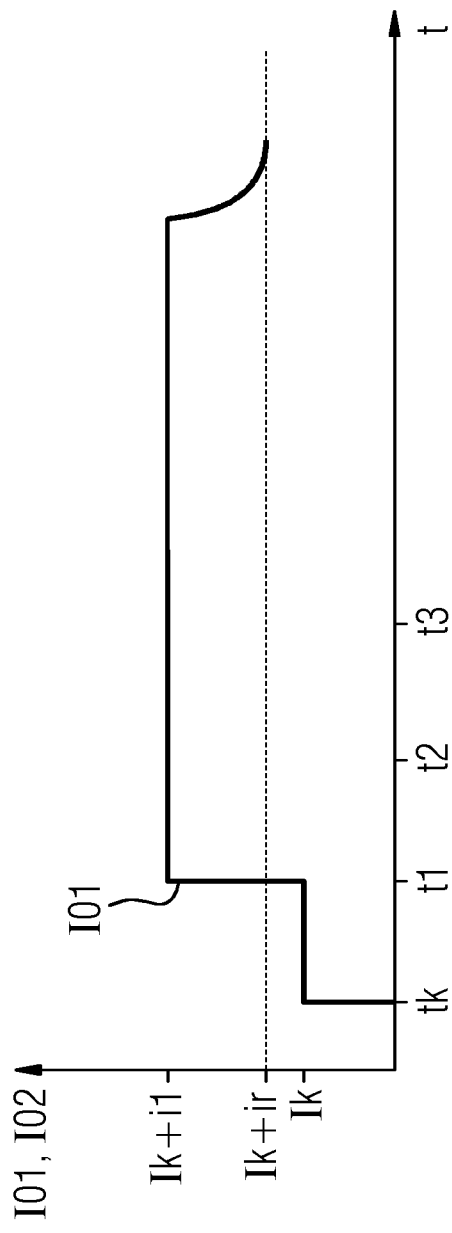
FIG. 8 shows, by way of example, the current profile in the exemplary embodiment according to FIG. 6.

FIG. 6 shows an exemplary embodiment of an arrangement 10 in which the grounding device 30 does not have a further current measuring device 140. After the grounding has been completed, which can be determined on the basis of the drop in the current I01 of the first current measuring device 130, the control device 150 can check the complete filling of the fluid line 100 with conductive fluid by comparing the current I01(t<tk<t1), which flows in the period between tk and t1 (cf. FIG. 8), with the current I01 at the end of the grounding operation. At the end of the grounding operation, when the fluid line 100 is filled, a partial current Ik will flow between the excitation point 102 and the connection point 103 via the resistance Rk and a partial current Ir will flow via the series circuit comprising the line resistances Rk, RLn, RL2, RL1 and RL0, as is the case in the exemplary embodiment according to FIG. 5 after the switching device 142 has been disconnected.

In the exemplary embodiments according to FIGS. 1 to 8, the conductive fluid can be drained again with the aid of a drain valve 160 (only illustrated in FIG. 1) after the grounding has been completed.

The above exemplary embodiments of a reference potential connecting device can be used, for example, to ground and discharge electrical converters having a multiplicity of submodules connected in series; in this case, each submodule can form a contact point to be discharged and/or grounded.

Exemplary embodiments of the invention can (but need not) have some or more of the following properties or advantages:

- Alternative to mechanical switching by gradually increasing the conductivity of a fluid in connecting hoses.
- Avoidance of sparks and wear and tear on mechanical contacts and components.
- No mechanical parts which have to be maintained or regularly tested.
- No actuating energy for a switching mechanism at the high-voltage level and no introduction of torque from a central location and transmission to the switching mechanism at the high-voltage level.
- Verification of the grounding safety by means of a test current.
- Serial connection of spatially distributed contact points to at least one grounding reference point with the aid of a fluid line (for example hose loop) through which a conductive fluid flows.
- Measurement of the grounding currents at one or two ground reference points of the loop.
- Optional signaling of the unsafe state, that is to say a grounding current which is still too high.
- Discharging of energy stores by means of fluid bridging of the discharge contacts using a suitable discharge resistor (long discharge period) or by controlling an additional discharge circuit (short discharge period).
- Optimized constructional presetting of the grounding and discharge currents by means of suitable, possibly prefabricated, resistors and electrical circuits with internal resistance and signaling.
- Avoidance of the excessive heating of the fluid by connecting parallel load resistors. As a result, saving on cooling and acceleration of the discharge and grounding operation.
- Protection of the grounding by verifying the safe connection by means of a test current or verifying the sufficiently high conductivity of the fluid.
- Control of the conductivity of the fluid with the aid of a simple or controlled Schmitt predictor and optionally a Luenberger observer.
- Sequence control of the grounding and discharge operation.
- Provision of a non-conductive fluid which can be made conductive by injecting a disassociating substance. The fluid should have a heat capacity which is as high as possible in order to be able to absorb the heat loss of the current flow in the fluid and should be temperature-stable. Optionally, it is also possible to use a fluid having a suitable basic conductivity which can be increased to a higher value by means of injection and can be reduced again by adding starting fluid.
- Opening of a valve (for example part of the injection device 110 according to FIGS. 1 to 6) for supplying the fluid and activation of a pump (for example part of the injection device 110 according to FIGS. 1 to 6) for filling the hose loop with the fluid. The loop has, for example, an air vessel and a ventilation valve and an overpressure valve and also, for example, a drain valve.
- Activation of the grounding and discharge process at a time t0 by increasing the desired current value of the conductivity control to the desired small value of the calibration current Ik. An associated controller (for example part of the injection device 110 according to FIGS. 1 to 6) activates the injection of the disassociating substance in order to increase the conductivity.
- Owing to the flow velocity of the fluid, an initial current I01=Ik through the medium is measured only after a dead time, that is to say at the time tk, at the first ground reference point M1. The current is the result of a low voltage Uk of, for example, 48 V which is applied to the pump at the start of this calibration section. The conductivity increases to the desired value I01=Ik by the time tk a result of control even before the conductive fluid column (for example water column) reaches the first contact point E1. The fluid in the pipe section between the pump and the ground reference point has the electrical line resistance Rk.
- At the time t1, the conductive fluid column reaches the first contact point E1, with the result that the current I01 at the reference point M1 increases suddenly by the grounding current i1 of the first contact point to a considerably higher value. The current-limiting resistor R1 at the first contact point E1 is preferably appropriately designed for this purpose with knowledge of the hose lengths of the calibration section and of the ground reference point M1 for the first contact point E1 (represented in the figures by the resistance values Rk and RL0 of the calibration line and of the supply line). The conductivity control is deactivated, but the metering is maintained to the same extent.

A light-emitting diode L1 with circuitry is optionally in parallel with the current-limiting resistor R1 in order to indicate the discharge operation (cf. FIG. 2, for example). The resistor can be the mechanical link between the hose sleeve and the contact point. It can be held in prefabricated form in discrete steps.

The resistive load of a relay 21 can also be used or added as a current-limiting resistor, which relay actively connects an additional discharge resistor Re in parallel with the hose connection RL2 to the adjacent contact point. As a result, the comparatively high-impedance hose connection containing fluid RL2 is supplemented with a low-impedance line resistance Re in order to accelerate the discharge operation between the two contact points and to avoid the resulting heat being introduced into the fluid. Optionally, additional electronics for current limitation can be connected in series with this relay 21 for protection.

As the conductive fluid column continues to flow, all contact points are successively wetted with conductive fluid.

When the conductive fluid column reaches the second ground reference point M2 at the time t4, a second connection to the reference potential is established.

When the conductive fluid column reaches the point of injection, there may be a current return flow Ir from the start of the calibration section in the direction of the second reference point M2. The hose loop is now completely filled with conductive medium and the grounding currents, the calibration current Ik and a return current Ir flow away via the two reference points M1 and M2.

If the sum current Ik+Ir has not yet reached a permitted maximum, the conductivity control can be activated again and the desired current value for increasing the conductivity, with the inclusion of the dead time of the overall system, can be dynamically increased to a maximum value. The discharging and grounding are accelerated.

A cooling unit (for example part of the injection device 110 according to FIGS. 1 to 6) can ensure the cooling of the conductive fluid which is heated as a result of the current flow. The temperature is preferably measured in the vicinity of the pump (for example part of the injection device 110 according to FIGS. 1 to 6) and is used to control the cooling unit, and the desired current value is therefore possibly influenced in order to favorably influence the conductance of the fluid in the sense of lower heating.

The conductivity can be reduced by adding clean fluid, that is to say actuating signals for reducing the conductance can be implemented if this is necessary, for example as a result of the heating of the fluid. The addition additionally has a cooling effect. Excess mixing fluid flows away via the overpressure valve or better via the accordingly controlled relief valve (for example the drain valve 160) (for example opening in the case of a negative actuating signal for a low hydrostatic counter-pressure).

The control can be replaced with pure control having two levels of injection. This extends the total discharge and grounding time owing to suboptimal conductivity and as a result of reduced grounding currents.

After the contact points have been discharged, the sum current is reduced to Ik+Ir, that is to say I01=Ik and I02=Ir. If the connection between the second reference point M2 and its ground is disconnected with the aid of the relay 142, Ik flows via the calibration section Rk and a reduced return current Ir flows via the series circuit comprising the contact points to the reference point M1. The sum current is reduced to I01=Ir+Ik, but remains greater than Ik. This verifies the safe connection of all contact points to the reference ground.

It is possible to optionally dispense with M2 and the further current measuring device 140. This extends the total discharge and grounding time on account of reduced grounding currents.

The calibration section between the excitation point 102 and the connection point 103 can be interrupted by means of a valve or can be tapered with a bypass, with the result that not only less fluid but also no current or a reduced electrical current Ik flows via this path. However, the reduced return current Ir remains at the same level. The assessment of this current Ir in comparison with the reduced current Ik becomes more accurate. The influence on the conductance and temperature of the fluid is now reduced and is possibly adaptively taken into account in the control. The circumstance is not critical because large grounding currents no longer flow in this operating situation.

The conductivity can be increased to its maximum value by increasing the desired current value in order to verify the safety in an even simpler manner with a return current which is increased as a result.

After the grounding, the pipe system is preferably emptied and dried by means of controlled opening of the relief valve and by blowing in an inert gas. The fluid can be collected for subsequent use after dilution or can be disposed of.

Although the invention has been illustrated and described more specifically in detail by means of preferred exemplary embodiments, the invention is not restricted by the disclosed examples and other variations can be derived therefrom by a person skilled in the art without departing from the scope of protection of the invention.

The following is a list of reference numerals and reference symbols used in the above description of the invention with reference to the drawing:

10 Arrangement
20 Device
21 Relay
30 Grounding device
100 Fluid line
101 Starting point
102 Excitation point
103 Connection point
104 Connection point
110 Injection device
120 Voltage source
130 Current measuring device
131 Measuring connection
132 Measuring connection
140 Current measuring device
141 Measuring connection
142 Switching device
150 Control device
200 Bypass circuit
C1 Capacitor
C2 Capacitor
C3 Capacitor E1 Contact point
E2 Contact point
E3 Contact point
FLS Fluid flow direction
Ik Current
Ir Current
I01 Current
I02 Current
i1 Current
i2 Current
i3 Current
L1 Light-emitting element
L2 Light-emitting element
Re Resistor
RL0 Resistance
RL1 Resistance
RL2 Resistance
Rk Resistance
RLn Resistance
R1 Series resistor
R2 Series resistor
R3 Series resistor
tk Time
t1 Time
t2 Time
t3 Time
t4 Time
Uk Measuring voltage
U1 Voltage
U2 Voltage
U3 Voltage

The invention claimed is:

1. An arrangement, comprising:
an electrical device having a plurality electrical contact points and having a fluid-based reference potential connecting device configured for connecting said electrical contact points to a reference potential;
said fluid-based reference potential connecting device having an annular fluid line that connects said contact points in series; and
when a fluid flows through said fluid line, said fluid successively wets said contact points, starting from a starting point, one contact point after another contact point, along a predefined flow direction.

2. The arrangement according to claim 1, wherein said reference potential connecting device has an injection device connected to said fluid line at an injection point and configured to feed conductive fluid into said fluid line at the injection point and/or for increasing a conductivity of a fluid in said fluid line by feeding in a substance that increases the conductivity of the fluid in said fluid line.

3. The arrangement according to claim 1, further comprising a series resistor and/or a light-emitting element connected at at least one of said contact points for conducting a current when a current flows via said at least one of said contact points.

4. The arrangement according to claim 1, wherein said electrical device has, at at least one of said contact points, a bypass circuit which, when current flows via said at least one of said contact points, establishes a conductive connection to another said contact point.

5. The arrangement according to claim 4, wherein said bypass circuit is configured to establish the conductive connection to a respective said contact point which is closest in terms of location and/or potential.

6. The arrangement according to claim 1, wherein the fluid line has a measuring section whose electrical conductivity is monitored, downstream of said injection point and upstream of said first contact point, in a fluid flow direction.

7. The arrangement according to claim 1, which comprises:
a current measuring device connected to said fluid line at a connection point downstream of said injection point and upstream of a first contact point in the fluid flow direction;
wherein said current measuring device has a first measuring connection connected to said connection point and a second measuring connection at reference potential; and
a current or voltage source connected at an excitation point between said injection point and said connection point of said current measuring device, said current or voltage source causing a current flow between said excitation point and said connection point as soon as the line section of said fluid line between said excitation point and said connection point has been filled with conductive fluid.

8. The arrangement according to claim 7, further comprising a control device connected to said current measuring device, said control device monitoring measured current values from said current measuring device and controlling said injection device.

9. The arrangement according to claim 8, which comprises:
a further current measuring device connected to said fluid line at a further connection point downstream of a last contact point and upstream of said injection point in the fluid flow direction;
said further current measuring device having a first measuring connection connected to said further connection point and a second measuring connection at reference potential, and wherein said further current measuring device is configured to capture a further current rise which occurs after conductive fluid has been fed in and/or after a substance increasing the conductivity has been fed in and after said further connection point has been reached by the conductive fluid.

10. The arrangement according to claim 9, wherein said control device is connected to said further current measuring device and is configured, on a basis of a captured further current rise, to conclude that said fluid line, up to and including the last contact point, has been filled with conductive fluid.

11. The arrangement according to claim 10, further comprising a switching device between said further connection point and reference potential and configured to interrupt a current flow between said further connection point and the reference potential, said control device being configured to disconnect said switching device after an adjustment operation has been concluded or after a current through said first and/or second current measuring device has fallen and to prevent a current flow through said second current measuring device to the reference potential, and said control device is configured to compare the measured current value before said first contact point is reached by the fluid with the measured current value after said switching device has been disconnected and to infer a closed conductive fluid circuit if the measured current value before said first contact point is reached by the fluid is lower than the measured current value after said switching device has been disconnected.

12. The arrangement according to claim 11, wherein said control device disconnects said switching device after a grounding operation has been concluded.

13. The arrangement according to claim 1, wherein said reference potential connecting device includes a drain valve enabling drainage of the fluid in said fluid line.

14. The arrangement according to claim 1, wherein the reference potential is ground potential, and said reference potential connecting device is a grounding device.

15. A method for connecting an electrical device, which has at least two electrical contact points, to a reference potential, the method comprising:
providing a fluid-based reference potential connecting device having an annular fluid line which connects the electrical contact points in series;
filling the annular fluid line with conductive fluid so as to form a conductive fluid ring; and/or
increasing a conductivity of a fluid in the fluid line by feeding in a substance that increases the conductivity; and
successively wetting the electrical contact points with the conductive fluid and, as a result, electrically connecting the electrical contact points to one another in succession.

16. The method according to claim 15, which comprises:
providing the electrical device with a series resistor and/or a light-emitting element connected to at least one of the contact points, and limiting a current flow via the contact point into the conductive fluid by the series resistor and/or the light-emitting element; and/or
providing the electrical device with a bypass circuit at at least one of the contact points and, when a current flows via the contact point, establishing a conductive connection to another contact point, and causing an immediate discharge between the contact points which are connected to one another; and/or
providing the fluid line with a measuring section downstream of the injection point in the fluid flow direction and, as seen in the flow direction, upstream of the first contact point, and monitoring an electrical conductivity of the measuring section; and/or
connecting a current measuring device to the fluid line at a connection point which is downstream of the injection point and upstream of the first contact point in the fluid flow direction, the current measuring device having a first measuring connection connected to the connection point and a second measuring connection at reference potential, and connecting a current or voltage source at an excitation point between the injection point and the connection point of the current measuring device, and causing with the current or voltage source a current to flow between the excitation point and the connection point as soon as the line section of the fluid line between the excitation point and the connection point has been filled with conductive fluid;
monitoring the measured current values from the current measuring device and controlling the injection device on a basis of the measured current values, and/or capturing a current rise, which occurs after conductive fluid has been fed in and/or after a substance which increases the conductivity has been fed in and after the first contact point has been reached by the conductive fluid, using the current measuring device, and concluding, on the basis of the current rise, that the fluid line up to the first connection point has been filled with conductive fluid, and/or capturing a further current rise, which occurs after the first contact point has been reached by the conductive fluid, using the current measuring device, and concluding, on the basis of the further current rise, that the fluid line up to the first contact point has been filled with the conductive fluid; and/or
connecting a further current measuring device to the fluid line at a further connection point downstream of the last contact point and upstream of the injection point in the fluid flow direction, the further current measuring device having a first measuring connection connected to the further connection point and a second measuring connection at reference potential, and monitoring the further measured current values from the further current measuring device, and/or capturing a current rise, which is measured by the further current measuring device and occurs after the conductive fluid has been fed in and/or after the substance which increases the conductivity has been fed in and after the further connection point has been reached by the conductive fluid, and concluding, on the basis of the current rise, that the fluid line, up to and including the last contact point, has been filled with conductive fluid; and/or
connecting a switching device between the further connection point and the reference potential for interrupting a current flow between the further connection point and the reference potential, and disconnecting the switching device after the grounding operation has been concluded or after the current flowing through the first and/or second current measuring device has fallen, and preventing a current flow through the second current measuring device to the reference potential; and/or
comparing the measured current value from the first current measuring device before the first contact point is reached by the fluid with the measured current value from the first current measuring device after the switching device has been disconnected, and inferring a closed conductive fluid circuit if the measured current value from the first current measuring device before the first contact point is reached by the fluid is lower than the measured current value from the first current measuring device after the switching device has been disconnected.

17. The method according to claim 16, which comprises, when the current flows via the contact point, establishing the conductive connection to the contact point which is closest in terms of location and/or potential.

* * * * *